United States Patent
Shin

(10) Patent No.: US 9,591,773 B2
(45) Date of Patent: Mar. 7, 2017

(54) DISPLAY DEVICE

(71) Applicant: LG ELECTRONICS INC., Seoul (KR)

(72) Inventor: Donghyok Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/904,378

(22) PCT Filed: Mar. 28, 2014

(86) PCT No.: PCT/KR2014/002678
§ 371 (c)(1),
(2) Date: Jan. 11, 2016

(87) PCT Pub. No.: WO2015/026035
PCT Pub. Date: Feb. 26, 2015

(65) Prior Publication Data
US 2016/0135305 A1    May 12, 2016

(30) Foreign Application Priority Data
Aug. 21, 2013  (KR) .................. 10-2013-0098949

(51) Int. Cl.
*H05K 5/00*    (2006.01)
*G02F 1/1333*    (2006.01)
*H05K 5/02*    (2006.01)

(52) U.S. Cl.
CPC ..... *H05K 5/0017* (2013.01); *G02F 1/133308* (2013.01); *H05K 5/0026* (2013.01); *H05K 5/0204* (2013.01); *H05K 5/0213* (2013.01); *H05K 5/0221* (2013.01); *G02F 2001/133322* (2013.01); *G02F 2201/46* (2013.01)

(58) Field of Classification Search
CPC combination set(s) only.
See application file for complete search history.

(56) References Cited

U.S. PATENT DOCUMENTS 7,269,023 B2 *  9/2007  Nagano .................. F16M 11/10
                                       361/679.55
7,345,870 B2 *  3/2008  Shin ....................... F16M 11/10
                                       248/917
(Continued)

FOREIGN PATENT DOCUMENTS

KR    10-2009-0131552 A    12/2009
KR    10-2011-0077272 A    7/2011
(Continued)

*Primary Examiner* — Lisa Lea Edmonds
(74) *Attorney, Agent, or Firm* — Birch, Stewart, Kolasch & Birch, LLP

(57) ABSTRACT

A display device comprises: a display panel; a rear surface panel coupled to the display panel by means of a first adhesive tape partially coated onto a rear surface of the display panel; a rigid bar which is arranged between the display panel and the rear surface panel and coupled to the rear surface of the display panel by means of a second adhesive tape, such that it is possible to provide a display device having sufficient rigidity while minimizing increase in thickness and reducing the weight of a structure for supporting the rear surface of the display panel by simultaneously using the rear surface panel and the rigid bar on the rear surface.

16 Claims, 9 Drawing Sheets

(56) References Cited

U.S. PATENT DOCUMENTS

| | | | | |
|---|---|---|---|---|
| 7,457,120 B2* | 11/2008 | Bae | ............ | H05K 7/20963 |
| | | | | 361/704 |
| 7,457,121 B2* | 11/2008 | Kim | ............ | H05K 7/20963 |
| | | | | 313/46 |
| 9,077,940 B2* | 7/2015 | Choi | ............ | H04N 5/64 |
| 9,080,719 B2* | 7/2015 | Koizumi | ............ | F16M 11/10 |
| 2009/0316371 A1 | 12/2009 | Kim et al. | | |
| 2010/0142151 A1* | 6/2010 | Bang | ............ | H05K 7/20963 |
| | | | | 361/707 |
| 2013/0038989 A1* | 2/2013 | Chang | ............ | H05K 5/0204 |
| | | | | 361/679.01 |
| 2013/0093960 A1* | 4/2013 | Kita | ............ | G02F 1/133308 |
| | | | | 348/725 |
| 2013/0114196 A1* | 5/2013 | Chen | ............ | G02F 1/133308 |
| | | | | 361/679.01 |
| 2013/0155585 A1 | 6/2013 | Kim et al. | | |
| 2013/0163200 A1* | 6/2013 | Takahashi | ............ | H05K 7/20972 |
| | | | | 361/692 |
| 2013/0170115 A1* | 7/2013 | Jung | ............ | G02F 1/00 |
| | | | | 361/679.01 |
| 2013/0170116 A1 | 7/2013 | In et al. | | |
| 2014/0168563 A1* | 6/2014 | Tang | ............ | G02F 1/133308 |
| | | | | 349/58 |
| 2015/0029710 A1* | 1/2015 | Kim | ............ | F21K 9/30 |
| | | | | 362/217.15 |
| 2015/0359337 A1* | 12/2015 | Bliven | ............ | F16M 13/02 |
| | | | | 361/679.01 |

FOREIGN PATENT DOCUMENTS

| | | |
|---|---|---|
| KR | 10-2011-0104832 A | 9/2011 |
| KR | 10-2013-0070422 A | 6/2013 |
| KR | 10-2013-0078661 A | 7/2013 |

* cited by examiner

DISPLAY DEVICE

CROSS REFERENCE TO RELATED APPLICATIONS

This application is the National Phase of PCT/KR2014/002678 filed on Mar. 28, 2014, which claims priority under 35 U.S.C. 119(a) to Korean Patent Application No. 10-2013-0098949 filed in the Republic of Korea on Aug. 21, 2013, all of which are hereby expressly incorporated by reference into the present application.

FIELD

Embodiments of the present invention relate to a display device having a supporting structure with a sufficient rigidity while minimizing increase in thickness and reducing the number of members coupled to a rear surface of a display panel.

BACKGROUND

A conventional structure of a display device using a liquid crystal display panel or a plasma display panel includes a glass panel, a middle frame and a rear cover so as to configurate a basic screen. The middle frame of the configurations is employed as a middle frame for arrangement of diverse circuits driving a display panel and connection between the glass panel and the rear cover. In contrast, the rear cover is employed to secure the whole rigidity of the display device and to efficiently emit the heat from the glass panel and the circuits outside. Also, the rear cover needs an additional function of defining a back exterior appearance of the display device.

Recently, many efforts are consistently under way to reduce thickness of a display device and there are attempts to simplify and improve the structure of the conventional display device. The decrease in the thickness of the display device results in continuous improvement of mechanical rigidity of the rear cover, development of materials and structure improvement for securing heat sink characteristics.

Especially, as an OLED display panel is used, the overall display panel can become dramatically thin. Such development of the display panel demands new materials and structures for providing sufficient rigidity while providing a thin rear surface panel supporting a back side of the display panel.

DETAILED DESCRIPTION OF THE INVENTION

Technical Problem

To overcome the disadvantages, an object of the present invention is to provide a display device having a supporting structure with a sufficient rigidity, while minimizing increase in thickness and reducing the number of members coupled to a rear surface of a display panel, and having a detachable rear surface panel to facilitate convenient maintenance.

Technical Solution

To achieve these objects and other advantages and in accordance with the purpose of the embodiments, as embodied and broadly described herein, s display device includes a display panel; a rear surface panel coupled to the display panel by means of a first adhesive tape partially coated onto a rear surface of the display panel; a rigid bar which is arranged between the display panel and the rear surface panel and coupled to the rear surface of the display panel by means of a second adhesive tape.

The rigid bar may further include a nut hole; and a screw fastened to the nut hole while penetrating the rear surface panel.

The display device may further include a mounting member coupled to a rear surface of the rear surface panel to hang or mount the display device on the wall or floor, wherein the mounting member is coupled to the rear surface of the rear surface panel by means of the screw fastened to the nut hole.

The display device may further include a gap pad provided in an area without the rigid bar between the display panel and the rear surface panel.

The thickness of the gap pad may be corresponding to the thickness of the rigid bar.

The second adhesive tape may be disposed between the rigid bar and the display panel and between the gap pad and the display panel.

The display device may further include a sitting groove formed in a front surface of the rear surface panel in a shape corresponding to a shape of the rigid bar.

The sitting groove may be formed in the rear surface panel in a press process and the sitting groove may be a forming portion having a recessed front side and a projected back side.

A vent hole may be formed in the forming portion toward an edge of the display panel.

An area of the forming portion may be 20% or less of an entire area of the rear surface panel.

A plurality of rigid bars may be arranged in vertical and horizontal directions and the plurality of the rigid bars may include at least one rigid bar arranged in the vertical direction and at least one rigid bar arranged in the horizontal direction.

The second adhesive tape may be a double-sided tape attached to the other area surface area of the display panel, except an area where the first adhesive tape is provided, and release paper may cover the other rear surface area of the second adhesive tape, except an area where the rigid bar is arranged.

The display device may further include a board panel coupled to the rear surface of the rear surface panel, the board panel where a drive substrate mounted, wherein the rigid bar is arranged in the other rear surface area of the rear surface panel, except an area where the board panel is coupled.

The rigid bar may include carbon fiber reinforced plastics (CFRP).

An area of the rigid bar may be 40% or less of an entire area of the display panel.

Rigidity of the rigid bar may be doubled or more than rigidity of the rear surface panel.

Advantageous Effects

According to at least one of the embodiments of the present disclosure, a display device is provided which has a supporting structure with a sufficient rigidity while minimizing increase in thickness and reducing the number of members coupled to a rear surface of a display panel.

Furthermore, a display device has an advantageous effect of easy maintenance, using an adhesion method and screw coupling method simultaneously.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

In general, a suffix such as "module" and "unit" may be used to refer to elements or components. Use of such a suffix herein is merely intended to facilitate description of the specification, and the suffix itself is not intended to give any special meaning or function.

By way of non-limiting example only, further description will be made with reference to particular types of display devices. However, such teachings apply equally to other types of devices, such as those types noted above.

Figure 1:
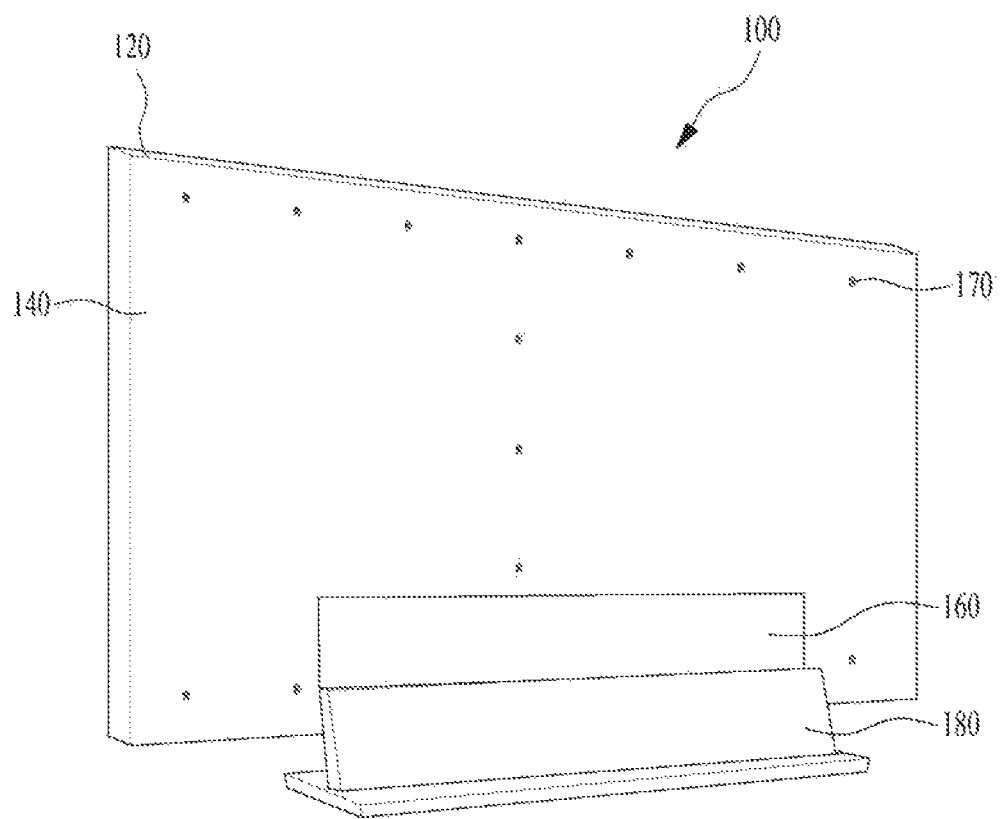
FIG. 1 is a perspective diagram illustrating a rear surface of a display device in accordance with a first embodiment of the present disclosure.
Figure 2:
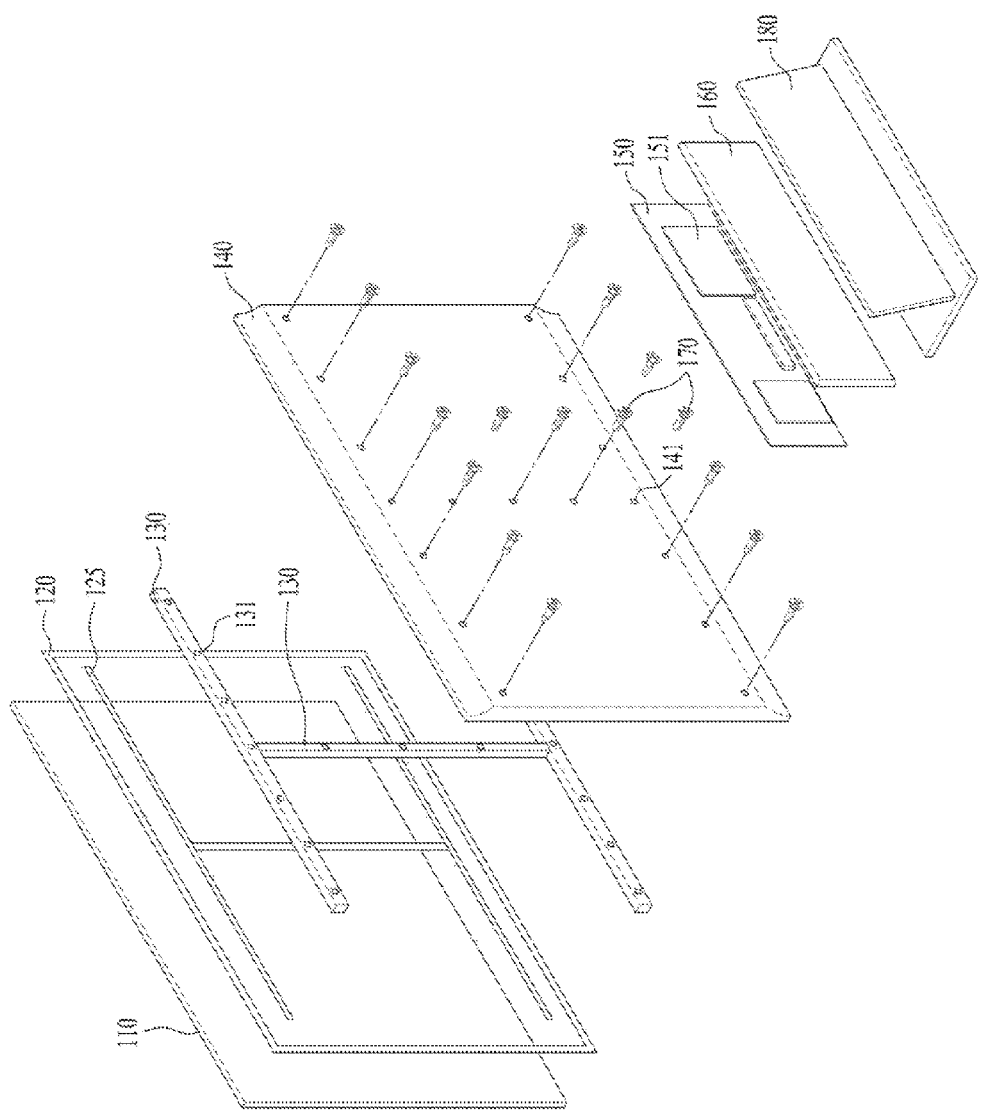
FIG. 2 is an exploded perspective diagram of the display device in accordance with the first embodiment of the present disclosure.

FIG. 1 is a perspective diagram illustrating a rear surface of a display device 100 in accordance with a first embodiment of the present disclosure. FIG. 2 is an exploded perspective diagram of the display device 100 in accordance with the first embodiment of the present disclosure. Referring to FIGS. 1 and 2, the display panel 100 includes a display panel 110, a rear surface panel 140, a rigid bar 130, a first adhesive tape 120 and a second adhesive tape 125.

The display panel 110 is a device for outputting an image on a screen and the screen is configured of pixels. Information including hue saturation intensity (HIS) for each pixel is digitalized into an electric signal and HIS for pixels is adjusted according to the electric signals, so that the screen can be controlled to emit light and to output an image.

Various displays such as a liquid crystal display, a thin film transistor liquid crystal display, a plasma display, an organic light-emitting diode (OLED) display and the like may be used as a flat panel display device functioned to output an image. Especially, OLED becomes popular because of its thinness as the next generation display panel 110. The OLED display has a simple structure with no backlight unit and it may realize the simple-structured and thin display device 100.

The rear surface panel 140 covers a rear surface of the display device 100 and it protects a rear surface of the display panel 110, while adding rigidity to the display panel 110 to support the display panel 110. To provide the thin display device 100, it is a recent trend to provide a thin rear surface panel 140 as well as the thin display panel 110.

As the structure of the display panel 110 becomes simple, it is difficult to couple the rear surface panel 140 to the display panel 110 by means of a screw 170. Accordingly, the rear surface panel 140 may be directly adhered to the rear surface of the display panel 110, using adhesive or a double-sided tape.

However, the screw-coupling structure using the screw 170 may allow the rear surface panel 140 to be easily decoupled from the display panel 110. The adhesive structure using the adhesive or double-sided tape is likely to damage the display panel 110, if an external force is applied to decouple the rear surface panel 140 from the display panel 110.

The display device 100 in accordance with the embodiments of the present disclosure is characterized to simultaneously use an adhesive structure and a screw-coupling structure, when the rear surface panel 140 is coupled to the display panel 110, so as to decouple and repair the rear surface panel 140.

As the display panel 100 becomes thinner, the display device 100 is likely to bend. To prevent the bending, the function of supporting the rear surface panel 140 is a crucial factor. It is necessary to fabricate the rear surface panel 140, using a stronger material than an injection mold.

A metallic material having a high rigidity such as steel is subject to bending, when fabricated thin. The rear surface panel 140 fabricated of the rigid metallic material has to be thick to get the desired rigidity and the weight of the rear surface panel 140 has to increase, together with increase in the price.

Instead of the metal, a high-strength synthetic material may be used to reduce the thickness and weight of the rear surface panel 140. For example, carbon fiber reinforced plastics (CFRP) is six times more than steel in a specific strength and three times in a specific rigidity. CFRP has not only high static strength but also high fatigue strength and then a good rub resistance and a good wear resistance. However, CFRP is substantially high-priced. When the rear surface panel is formed of CFRP, the production cost increases disadvantageously.

The display device in accordance with the embodiment provides the support structure which can minimize increase in weight and thickness while providing a sufficient rigidity. For that, metal and carbon fiber reinforced plastic is combinedly used to form the rear surface of the display panel 110.

As shown in FIG. 2, the rear surface panel 140 formed of metal such as steel and the rigid bar 130 formed of CFRP are provided to support the rear surface of the display panel 110.

Figure 3:
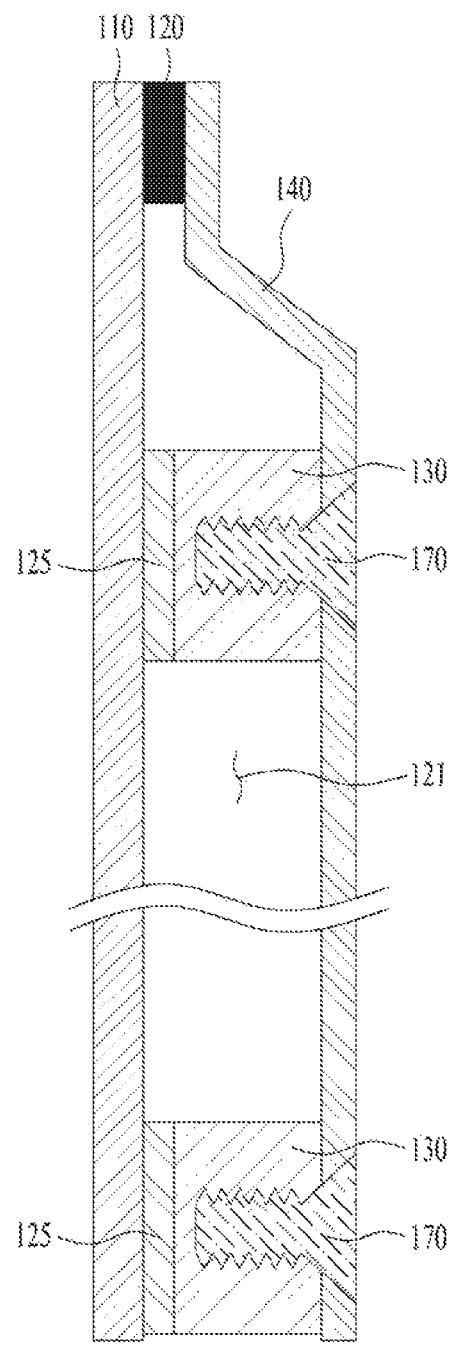
FIG. 3 is a sectional diagram of the display device in accordance with the first embodiment of the present disclosure.
Figure 4:
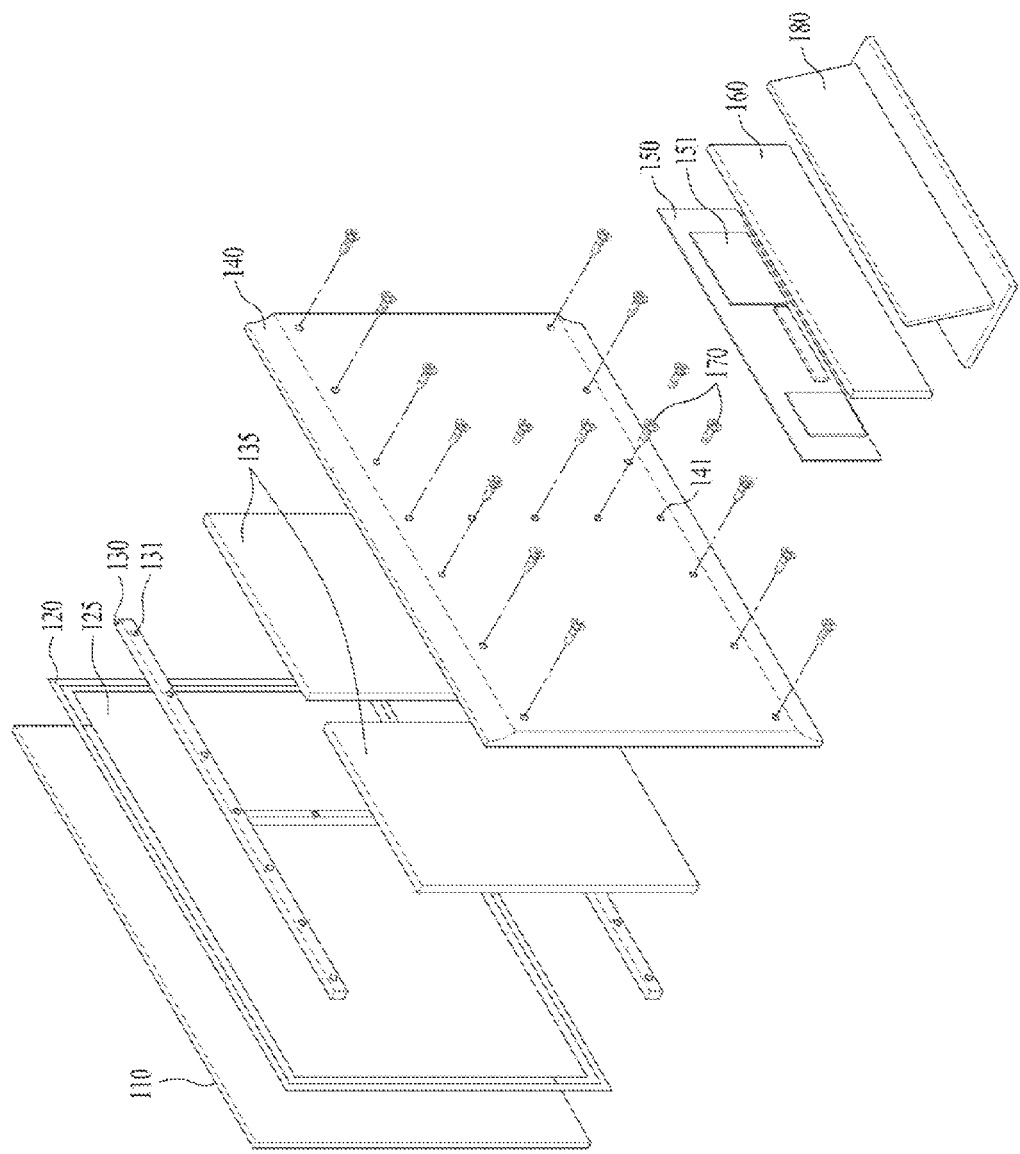
FIG. 4 is an exploded perspective diagram of a display device in accordance with a second embodiment of the present disclosure.

The rigid bar 130 shown in FIG. 3 may be arranged perpendicular to the rear surface of the display panel. To prevent the bending, it is preferred that the rigid bar 130 is arranged in a vertical or horizontal direction in which the bending occurs, compared with a diagonal direction. In other words, the rigid bar 130 is arranged in H shape or lattice shape.

In the drawing, two rigid bars 130 are provided in a horizontal direction and one rigid bar 130 is provided in a vertical direction. More bending occurs in the horizontal direction and more rigid bars 130 may be arranged in the horizontal direction.

The material having rigidity which is approximately two times or more than the material used in forming the rear surface panel 140 may be used in forming the rigid bar 130, for example, carbon fiber reinforced plastics (CFRP) having a higher rigidity than steel used in forming the rear surface panel 140 may be used in forming the rigid bar 130. CFRP is at least doubled than steel in rigidity, so that the rear surface panel 140 even with the reduced thickness may support the display panel 110 sufficiently enough to prevent the bending.

The rigid bar 130 is formed of a synthetic material and the composition of the rigid bar 130 may be adjusted to adjust rigidity or thermal expansion coefficient. The composition of the rigid bar 130 is adjusted to have a similar thermal expansion coefficient to glass. Accordingly, the bending generated by difference between the rigid bar 130 and the display panel 110 in thermal expansion.

As the rigid bar 130 has a more cross section area, the display device has a higher rigidity. Considering increase in weight and thickness as well as production cost, the rigid bar 130 may be designed with a proper size. For example, the cross section area of the rigid bar 130 may be $9 \times 10^{-5}$ $m^2$ or more and $1.2 \times 10^{-5}$ $m^2$ or less. In other words, a bar-shaped member with a width of approximately 15~20 mm which is adhered to the display panel 110 and a thickness of approximately 6 mm may be used as the rigid bar 130.

As the rigid bar 130 has a wider area arranged in the rear surface of the display panel 110, the rigid bar 130 has a higher rigidity. If too many rigid bars 130 are arranged, the production cost might increase and there is no different than providing the rear surface panel formed of CFRP. Accordingly, it is preferred that the rigid bars 130 occupy 40% or less of the display panel area.

A board panel 150 in which a drive substrate 151 and other components are mounted may be further provided in the rear surface of the rear surface panel 140. The board panel 150 is a metallic member, for example, aluminum and additionally provided in the rear surface panel 140 to provide a supporting force against the bending of the display panel 110. When the board panel 150 is attached to the rear surface of the rear surface panel 140, no rigid bars 130 may be provided in the area of the display panel corresponding to the area of the rear surface panel where the board panel 150 is provided.

When the rigid bar 130 is attached to the display panel 110, an adhesive tape 125 having strong adhesive force is used to compensate the bending force of the display panel 110.

The rear surface panel 140 is attached to the display panel 110, while covering the rigid bars 130. If using an adhesive tape with too strong adhesion, it is difficult to decouple the rear surface panel 140 from the display panel for maintenance as mentioned above. In contrast, if using an adhesive tape with less strong adhesion, the bending of the display panel 110 fails to be compensated and decouples the rear surface panel 140 from the display panel 110 disadvantageously.

In the display device 100 in accordance with the embodiment of the present disclosure, the display panel 110 and the rear surface panel 140 are coupled to each other by means of a screw 170 to prevent the separation of the rear surface panel 140 from the display panel 110, while an adhesive tape 120 with relatively less strong adhesion is provided between the display panel 110 and the rear surface panel 140 along a predetermined portion of the rear surface of the display panel 110 (e.g., a circumferential portion of the display panel 110).

FIG. 3 is a sectional diagram of the display device 100 in accordance with the first embodiment of the present disclosure. A nut hole 131 is formed in the rigid bar 130 and a screw 170 is inserted in the nut hole 131 while penetrating the rear surface panel 140, and couples the rear surface panel 140 and the rigid bar 130 to each other. The rigid bar 130 is attached by means of an adhesive tape 125 with strong adhesion, to prevent the separation of the rear surface panel 140 from the display panel 110.

The nut hole 131 may be used in coupling a mounting material for mounting a stand 180 or a wall-hanging structure (not shown) to the display device 100. The stand 180 is configured to stand the display device 100 on the floor and the wall-hanging structure is configured to hang the display device 100 on the wall. The mounting material has to support the overall load of the display device 100 and receives quite a force, so that it may be coupled to the display panel firmly.

The mounting material may be fixed to the rear surface of the display panel 110 via the nut hole 131 by means of the screw 170. The rigid bar is fixed to the display panel 110 by means of the adhesive with the strong adhesive force, so that the display device 100 can be hung on the wall or stand on the floor stably.

In addition, the load is not intensively applied only to the coupling portion between the mounting member and the display device 100 but dispersed in the entire area of the rigid bar 130. The pressing generated in the display panel 110 by the force partially applied to the display panel 110 may be prevented.

Hereinafter, the adhesive tape for attaching the rear surface panel 140 to the display panel 110 is a first adhesive tape 120 and the adhesive tape for attaching the rigid bar 130 to the display panel 110 is a second adhesive tape 125.

As shown in FIGS. 2 and 3, the rear surface panel 140 is projected toward the rear surface to provide a predetermined space where the rigid bar 130 is arranged. The edge area where the first adhesive tape 120 is arranged is relatively toward a front surface to contact with the display panel 110.

When such the rear surface panel 140, there might be a disadvantage of an empty space 121 formed between the rigid bar 130 and the display panel 110 as shown in FIG. 3. Air has low thermal conductivity and heat could be blocked in an air layer, only to raise the temperature continuously.

To solve the disadvantage of the rising temperature, a gap pad 135 may be further provided in the empty space 121 to get rid of the air layer generated by the empty space 121. The gap pad 135 may be formed of a material with a higher thermal conductivity than air. The gap pad 135 may be formed of silicon and the heat sink performance of the display device 100 may be enhanced accordingly.

Figure 5:
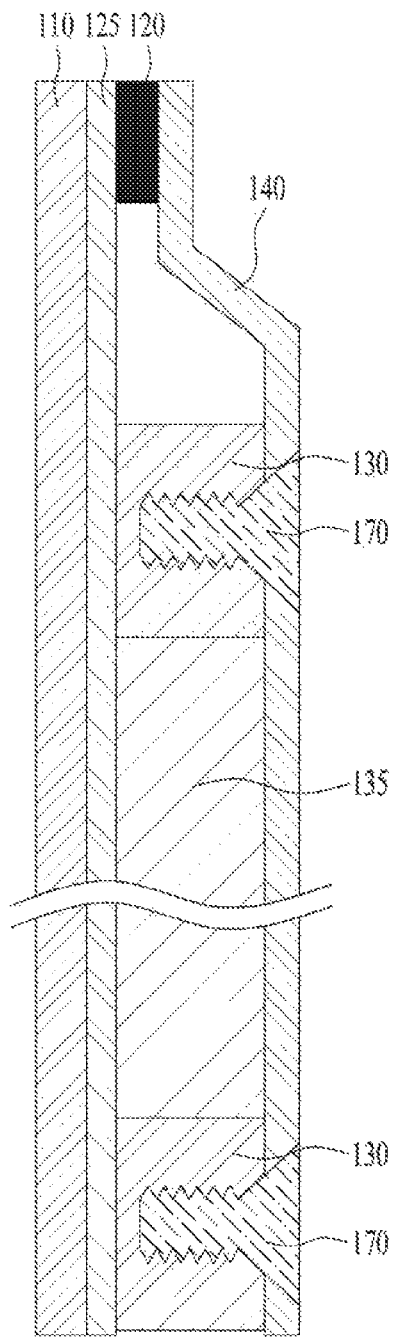
FIG. 5 is a sectional diagram of the display device in accordance with the second embodiment of the present disclosure.

The gap pad 135 may be attached to the display panel 110 by means of an adhesive tape. At this time, a tape with a relatively weak adhesive force may be used. Considering process efficiency, the second adhesive tape 125 is attached to the entire rear surface area of the display panel 110, except the area where the first adhesive tape 120, as shown in FIG. 5. In other words, the second adhesive tape 125 secures the rigid bar 130 and attaches the gap pad 135 at the same time in this embodiment.

Figure 6:
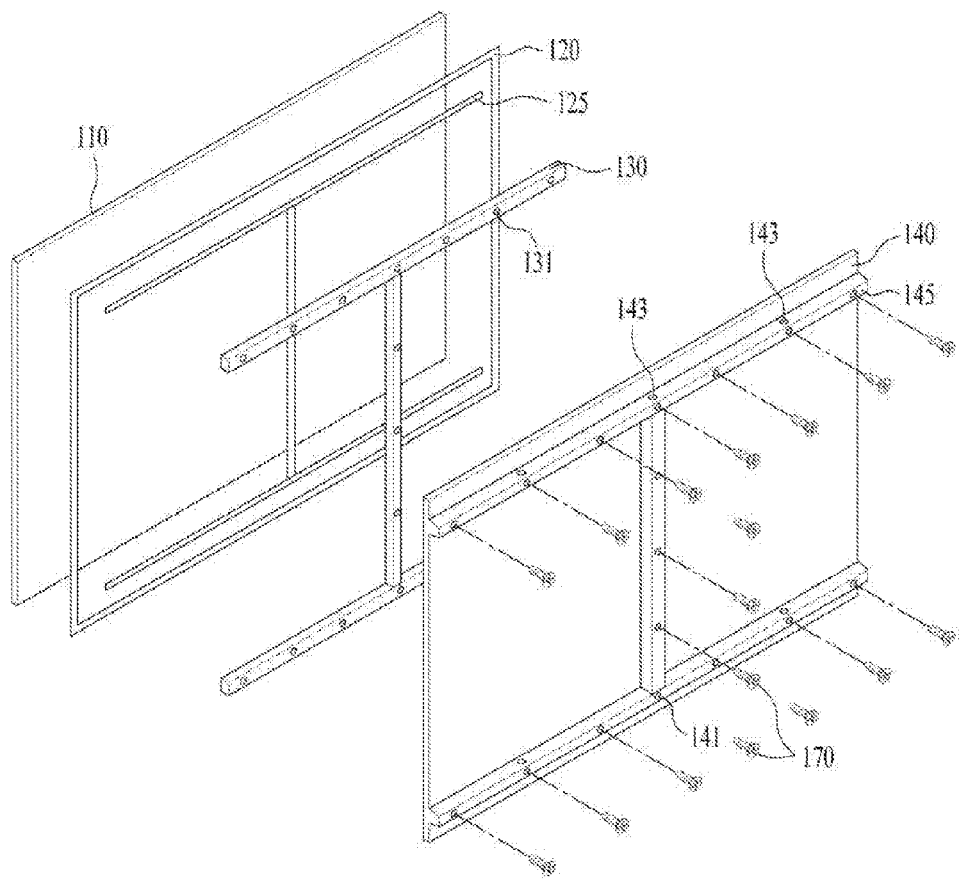
FIG. 6 is an exploded perspective diagram of a display device in accordance with a third embodiment of the present disclosure.
Figure 7:
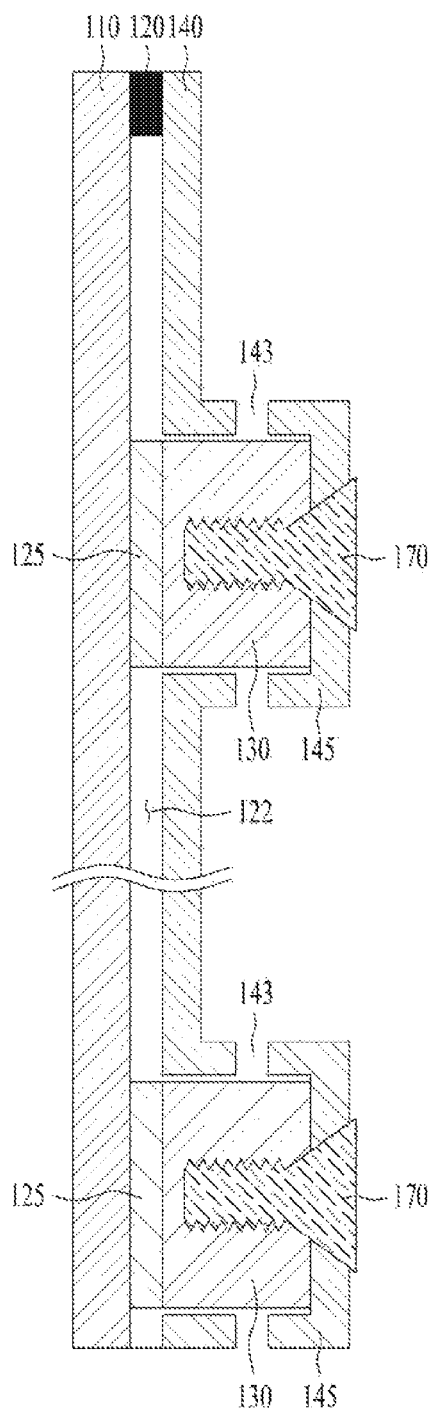
FIG. 7 is a sectional diagram of the display device in accordance with the third embodiment of the present disclosure.

Next, FIGS. 6 and 7 are exploded perspective and sectional diagrams of the display device 100 in accordance with a third embodiment of the present disclosure. In the third embodiment, the rear surface panel 140 includes a sitting groove 140 provided in a front surface, corresponding to the rigid bar 130. The space 121 formed between the display panel 110 and the rear surface panel 140 is filled with air having low thermal conductivity and the heat sink capacity of the space 121 is deteriorated accordingly. The space formed in the area between the display panel 110 and the rear surface panel 140, without the rigid bar 130, may be minimized.

The sitting groove may be formed in the rear surface panel 140 formed with a predetermined thickness in a cutting process. In this instance, the weight and material cost of the rear surface panel 140 might increase advantageously. In this embodiment, the rear surface panel 140 is pressed to form a forming portion 145 having a recessed front side and a projected back side.

A bending process is performed or the forming portion 145 is formed in a plate-shaped material, the rigidity may be enhanced. Accordingly, when the forming portion 145 is formed in the rear surface panel 140, resistance against the bending of the display panel 110 may be enhanced.

When the forming portion 145 is formed, the rigidity may increase. The forming portion has to occupy 40% or more of the rear surface panel 140 only to support the rear surface of the display device, only using the rear surface panel 140 having the forming portion 145.

However, the forming portion 145 occupying too broad area substantially increases the thickness of the display device 100 as much as the projected height of the forming portion. Considering the thickness of the display device 100, it is preferred that the forming portion 145 occupies 20% or less of the overall area.

To solve the contradictory requirements, the rigid bar 130 and the forming portion 145 may be provided simultaneously in the rear surface structure of the display panel 110. When both of the rigid bar 130 and the forming portion 145 are provided, the forming portion 145 and the rigid bar 130 which are arranged only in 20% or less of the entire area of the display panel 110 may prevent the bending of the display panel 110 sufficiently.

As shown in FIG. 7, a space 122 corresponding to the thickness of the adhesive tapes 120 and 125 is formed between the display panel 110 and the rear surface panel 140. When air holds heat in the space 122, the temperature of the display device 100 might rise disadvantageously. A vent hole 143 is formed to allow hot air flow out from the space between the display panel 110 and the rear surface panel 140.

At this time, the vent hole 143 may be formed in a predetermined area of the forming portion 145 toward the edge portion of the display panel 110 to make the vent hole 143 invisible from the rear surface as shown in FIG. 7.

Figure 8:
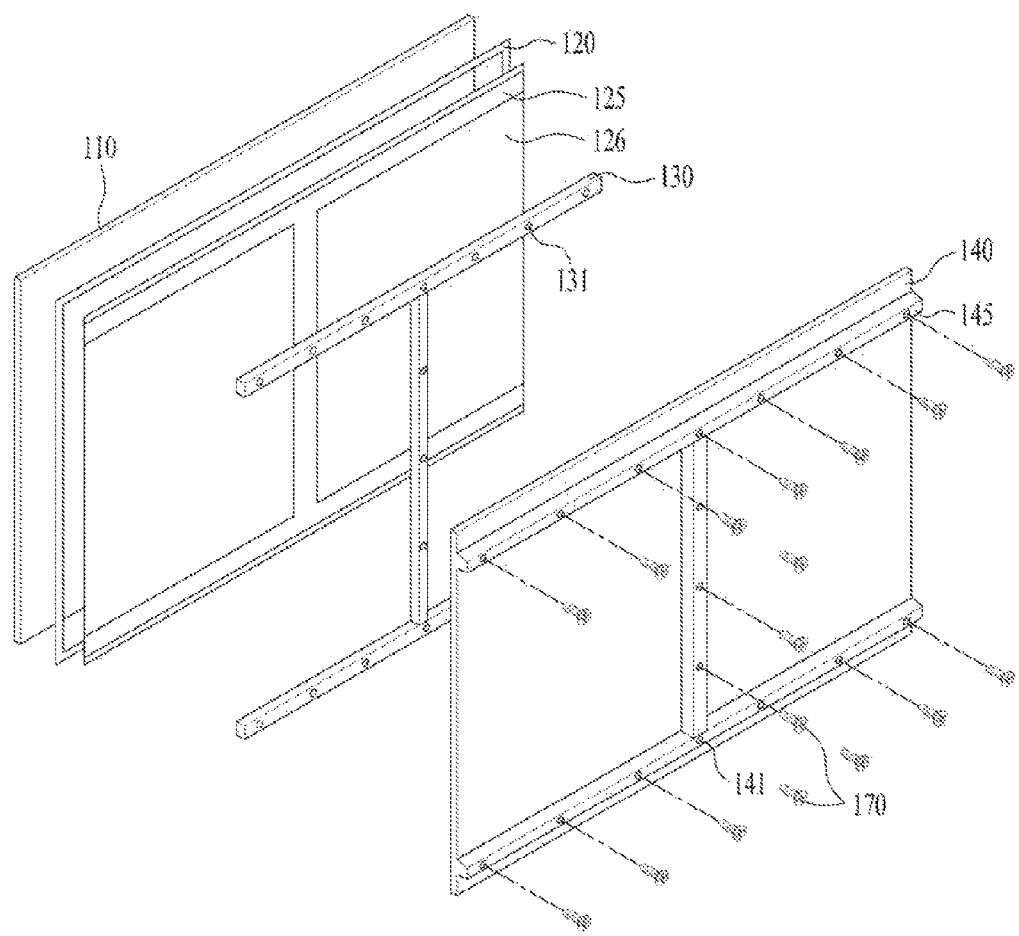
FIG. 8 is an exploded perspective diagram of a display device in accordance with a fourth embodiment of the present disclosure.
Figure 9:
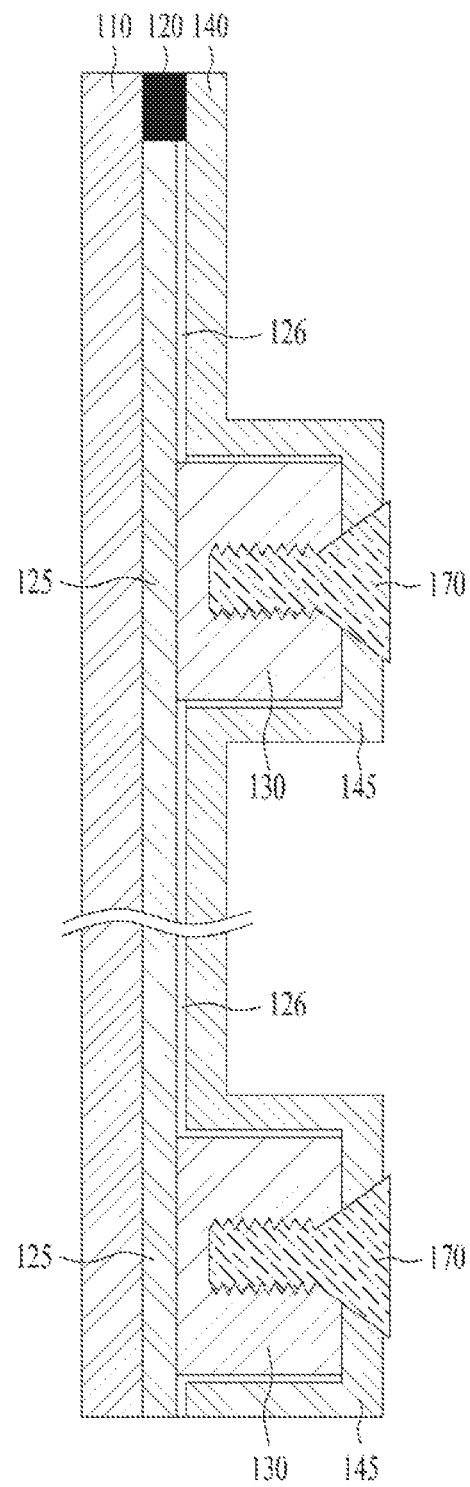
FIG. 9 is a sectional diagram of the display device in accordance with the fourth embodiment of the present disclosure.

FIGS. 8 and 9 are exploded perspective and sectional diagrams of the display device in accordance with a fourth embodiment of the present disclosure. In this embodiment, the second adhesive tape 125 is attached to the entire area of the display panel 110 to fill the space formed between the display panel 110 and the rear surface panel 140 mentioned in the third embodiment.

When the rear surface panel 140 is coupled to the display panel 110 by means of the second adhesive tape 125, the adhesion force is strong enough not to decouple the rear surface panel 140 from the display panel 110. Because of that, a film is disposed between the second adhesive tape 125 and the rear surface panel 140.

Release paper 126 is used as the film material. The release paper 126 is a film material for protecting an adhesive surface before using the second adhesive tape 125 and it is removed before the second adhesive tape 125 is used. In this embodiment, the release paper 126 is removed from the location where the rigid bar 130 is desired to be attached and the rigid bar 130 is attached to the rear surface of the display panel 110 by means of the second adhesive tape 125 through the location. The release paper disposed in the other area is left to prevent the rear surface panel 140 from being fixedly coupled to the display panel 110.

The second adhesive tape 125 is attached to the other rear surface area of the display panel 110, except the area where the first adhesive tape 120 is provided. The space 122 formed between the display panel 110 and the rear surface panel 140 is filled with the second adhesive tape, so that the disadvantage of the deteriorated heat sink efficiency generated by the air layer may be solved as shown in FIG. 9.

In at least one of the embodiments, the rigid bar 130 and the rear surface panel 140 provided in the rear surface of the display device 100 are used simultaneously. Accordingly, the number of the members coupled to the rear surface of the display panel 110 may be reduced and the increase in thickness may be minimized, while the sufficient rigid supporting structure may be provided.

Moreover, the adhesive method and the screw-coupling method are used simultaneously, so that the maintenance of the display device 100 can be performed simply and easily.

When a particular feature, structure, or characteristic is described in connection with any embodiment, it is submitted that it is within the purview of one skilled in the art to affect such feature, structure, or characteristic in connection with other ones of the embodiments.

By way of non-limiting example only, further description will be made with reference to particular types of display devices. However, such teachings apply equally to other types of devices, such as those types noted above.

What is claimed is:

1. A display device comprising:
   a display panel;
   a rear surface panel coupled to the display panel by means of a first adhesive tape partially coated onto a rear surface of the display panel;
   a rigid bar which is arranged between the display panel and the rear surface panel and coupled to the rear surface of the display panel by means of a second adhesive tape.

2. The display device of claim 1, wherein the rigid bar further comprises,
   a nut hole; and
   a screw fastened to the nut hole while penetrating the rear surface panel.

3. The display device of claim 2, further comprising:
   a mounting member coupled to a rear surface of the rear surface panel to hang or mount the display device on the wall or floor,
   wherein the mounting member is coupled to the rear surface of the rear surface panel by means of the screw fastened to the nut hole.

4. The display device of claim 1, further comprising:
   a gap pad provided in an area without the rigid bar between the display panel and the rear surface panel.

5. The display device of claim 4, wherein the thickness of the gap pad is corresponding to the thickness of the rigid bar.

6. The display device of claim 4, wherein the second adhesive tape is disposed between the rigid bar and the display panel and between the gap pad and the display panel.

7. The display device of claim 5, wherein an area of the forming portion is 20% or less of an entire area of the rear surface panel.

8. The display device of claim 1, further comprising:
   a sitting groove formed in a front surface of the rear surface panel in a shape corresponding to a shape of the rigid bar.

9. The display device of claim 8, wherein the sitting groove is formed in the rear surface panel in a press process and
   the sitting groove is a forming portion having a recessed front side and a projected back side.

10. The display device of claim 9, wherein a vent hole is formed in the forming portion toward an edge of the display panel.

11. The display device of claim 1, wherein a plurality of rigid bars are arranged in vertical and horizontal directions and the plurality of the rigid bars comprise at least one rigid bar arranged in the vertical direction and at least one rigid bar arranged in the horizontal direction.

12. The display device of claim 1, wherein the second adhesive tape is a double-sided tape attached to the other area surface area of the display panel, except an area where the first adhesive tape is provided, and
   release paper covers the other rear surface area of the second adhesive tape, except an area where the rigid bar is arranged.

13. The display device of claim 1, further comprising:
   a board panel coupled to the rear surface of the rear surface panel, the board panel where a drive substrate mounted,
   wherein the rigid bar is arranged in the other rear surface area of the rear surface panel, except an area where the board panel is coupled.

14. The display device of claim 1, wherein the rigid bar comprises carbon fiber reinforced plastics (CFRP).

15. The display device of claim 1, wherein an area of the rigid bar is 40% or less of an entire area of the display panel.

16. The display device of claim 1, wherein rigidity of the rigid bar is doubled or more than rigidity of the rear surface panel.

* * * * *